(12) United States Patent
Chuang et al.

(10) Patent No.: US 9,412,850 B1
(45) Date of Patent: Aug. 9, 2016

(54) METHOD OF TRIMMING FIN STRUCTURE

(71) Applicant: TAIWAN SEMICONDUCTOR MANUFACTURING CO., LTD., Hsinchu (TW)

(72) Inventors: Kuo-Sheng Chuang, Hsinchu (TW); You-Hua Chou, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 36 days.

(21) Appl. No.: 14/597,700

(22) Filed: Jan. 15, 2015

(51) Int. Cl.
| | | |
|---|---|---|
| H01L 21/82 | (2006.01) | |
| H01L 29/66 | (2006.01) | |
| H01L 21/306 | (2006.01) | |
| H01L 21/308 | (2006.01) | |
| H01L 29/10 | (2006.01) | |
| H01L 21/8234 | (2006.01) | |
| H01L 21/84 | (2006.01) | |

(52) U.S. Cl.
CPC ...... H01L 29/66818 (2013.01); H01L 21/3085 (2013.01); H01L 21/3086 (2013.01); H01L 21/30625 (2013.01); H01L 21/823431 (2013.01); H01L 29/1037 (2013.01); H01L 29/66795 (2013.01)

(58) Field of Classification Search
None
See application file for complete search history.

(56) References Cited

U.S. PATENT DOCUMENTS

| | | | | |
|---|---|---|---|---|
| 2002/0196651 A1* | 12/2002 | Weis | ................. | H01L 27/10841 365/100 |
| 2014/0175543 A1* | 6/2014 | Glass | .............. | H01L 21/823431 257/337 |
| 2015/0318169 A1* | 11/2015 | Qi | ....................... | H01L 21/0262 438/283 |

* cited by examiner

*Primary Examiner* — Johannes P Mondt
(74) *Attorney, Agent, or Firm* — Maschoff Brennan

(57) ABSTRACT

A method of trimming a fin structure includes the following operations: (i) forming a fin structure on a substrate; (ii) epitaxially growing an epitaxy structure cladding the fin structure, in which the epitaxy structure has a first lattice plane with Miller index (111), a second lattice plane with Miller index (100) and a third lattice plane with Miller index (110); and (iii) removing the epitaxy structure and a portion of the fin structure to obtain a trimmed fin structure.

20 Claims, 8 Drawing Sheets

METHOD OF TRIMMING FIN STRUCTURE

BACKGROUND

The semiconductor integrated circuit (IC) industry has experienced rapid growth. Technological progress in IC manufacture has produced several generations of ICs, and each generation fabricates smaller and more complex circuits than the previous generation. Currently, the semiconductor industry has progressed into nanometer technology nodes for higher device density and better electrical performance, and a variety of challenges from fabrication and design have led semiconductor technologies to three dimensional designs, such as fin-like field effect transistors (FinFETs). A typical FinFET is fabricated with a thin "fin" extending on a substrate. The channel of the FinFET is formed in the fin. In addition, a gate is formed to wrap the fin, and therefore a tri-gate structure is fabricated. It is beneficial to have a gate on three sides of the channel that allows the gate to control the channel from several sides. FinFET devices further include strained source/drain features to enhance carrier mobility and improve device performance. However, as device scaling down continues, conventional techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
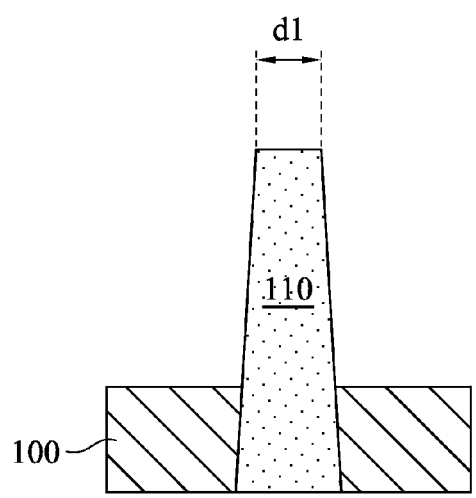
FIGS. 1A-1H are schematic cross-sectional views showing methods for trimming a fin structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "under," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates generally to a method of trimming a fin structure for an active device such as for example a fin-like field effect transistor (FinFET). In the FinFET, when the width of the fin structure is less than certain dimension such as for example 16 nm, the carrier mobility of the FinFET is unsatisfied, and a strain inducing layer covering the fin structure is used to enhance the carrier mobility. Nevertheless, when the strain inducing layer is formed on the fin structure, the width of the fin structure is unfavorably increased. Accordingly, in order to shrink the fin width, the fin structure is trimmed prior to forming the strain inducing layer. However, conventional fin-trimming techniques suffer problems in that a tip-top is formed on the top of the fin structure, and that leads to a poor electrical performance.

Accordingly, the present disclosure provides a novel method of trimming a fin structure that at least resolves the issue of the tip-top. Various embodiments of the present disclosure will be described in detail hereinafter.

FIGS. 1A-1H are schematic cross-sectional views showing methods for trimming a fin structure according to various embodiments of the present disclosure.

As shown in FIG. 1A, a fin structure 110 is formed over a substrate 100. According to various embodiments, the substrate 100 includes semiconductor material. In some embodiments, the substrate 100 may be a silicon-on-insulator (SOI) substrate. The SOI substrate may be fabricated using any suitable methods. For example, the SOI substrate can be formed using separation by implantation of oxygen, wafer bonding, or other methods. In some embodiments, the substrate 100 may be a bulk silicon substrate. In yet some embodiments, the substrate 100 include an elementary semiconductor such as for example germanium or silicon in a crystalline structure. In yet some embodiments, the substrate 100 include a compound semiconductor such as for example gallium arsenic, silicon carbide, indium phosphide, gallium phosphide or indium antimonide, or combinations thereof. Furthermore, in some examples, the substrate 100 may include isolation structures, such as for example shallow trench isolation structures. The isolation structure may surround the fin structure 110, so that the fin structure 110 may be isolated from other features. In addition, the substrate 100 may include various doped regions and other features according to some embodiments of the present disclosure.

According to various embodiments of the present disclosure, the fin structure 110 includes crystalline silicon. In some embodiments, the top surface of the fin structure 110 has a lattice plane with Miller index (100), and the sidewall of the fin structure 110 has a lattice plane with Miller index (110). In yet some embodiments, the fin structure 110 may include a lower part containing silicon (Si) and an upper part containing silicon germanium (SiGe). In yet some embodiments, the fin structure 110 may be doped during deposition by adding impurities to the source/drain material of the epitaxy process or subsequent to its deposition process by an ion implantation process. In various examples, the fin structure 110 has a width d1 which is ranged from about 5 nm to about 25 nm. In some examples, the width d1 may be about 5 nm to about 15 nm. In yet some examples, the width d1 may be about 10 nm to about 20 nm. In yet some examples, the width d1 may be about 15 nm to about 25 nm. One skilled in the art will appreciate that a single fin structure 110 is shown for illustrative purposes only. As such, some embodiments may include a plurality of fin structures 110.

Figure 1B:
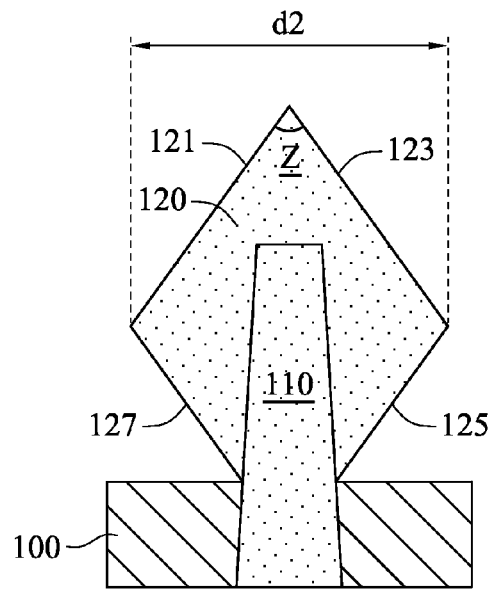

Referring to FIG. 1B, an epitaxy structure 120 is formed on the fin structure 110. In various embodiments, the epitaxy structure 120 includes the same material as the fin structure 110 so that semiconductor material may be epitaxially grown on the exposed surface of the fin structure 110 to form the epitaxy structure 120. In some embodiments, the epitaxy process may use molecular beam epitaxy, vapor-phase epitaxy (VPE), ultra-high vacuum CVD (UHV-CVD)) or other suitable techniques. The epitaxy process may use precursors which interact with the composition of the fin structure 110. In some examples, the precursors interact with silicon of the fin structure 110. In yet some examples, the precursors interact with silicon germanium (SiGe) of the fin structure 110.

In some embodiments, the epitaxy structure 120 includes a first lattice plane 121, a second lattice plane 123, a third lattice plane 125 and a fourth lattice plane 127. In some examples, the first lattice plane 121 and the second lattice plane 123 form a top angle Z of the epitaxy structure 120, and the top angle Z may be about 50 degrees to about 60 degrees. In yet some examples, each of the first, second, third and fourth lattice planes 121, 123, 125, 127 has Miller index (111).

In yet some embodiments, the epitaxy structure 120 has a maximum width d2 that is about 2 folds to about 7 folds of the width d1 of the fin structure 110. In some examples, the maximum width d2 may be about 2.5 folds to about 6 folds of the width d1 of the fin structure 110. For example, the maximum width d2 of the epitaxy structure 120 may be about 25 nm to about 60 nm. In some examples, the width d2 may be about 25 nm to about 40 nm. In yet some examples, the width d2 may be about 30 nm to about 50 nm. In yet some examples, the width d2 may be about 40 nm to about 60 nm.

Figure 1C:
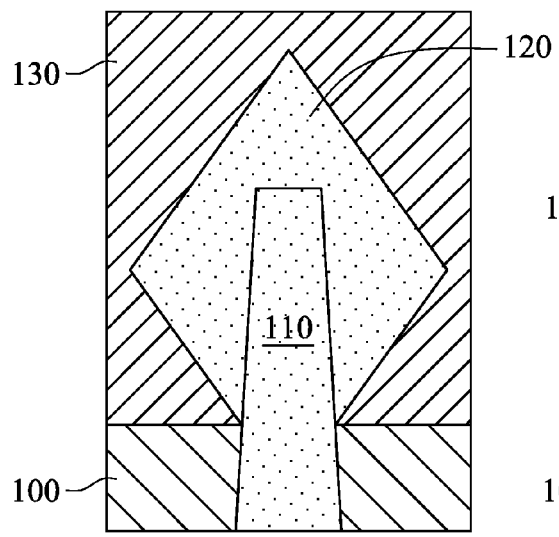

Subsequently, as shown in FIG. 1C, a planar layer 130 is formed to cover the epitaxy structure 120. In some embodiments, the planar layer 130 may be formed by coating a layer of flowable oxide on the substrate 100, and then an annealing process is performed to form the planar layer 130. Therefore, the planar layer 130 may be an oxide layer, and have a substantially flat surface according to some examples of the present disclosure. Furthermore, in some embodiments of the present disclosure, the space under the lattice planes 125, 127 (shown in FIG. 1B) of the epitaxy structure 120 may be filled with the planar layer 130.

Figure 1D:
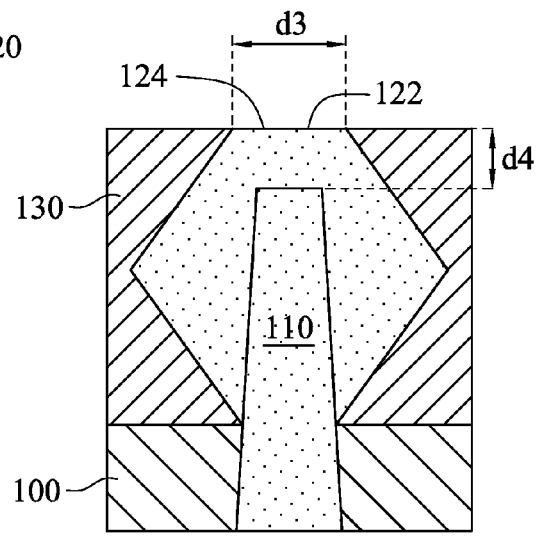

Thereafter, as illustrated in FIG. 1D, a portion of the planar layer 130 and a portion of the epitaxy structure 120 are removed such that a portion 122 of the epitaxy structure 120 is exposed out of the planar layer 130. In some embodiments, portions of the planar layer 130 and the epitaxy structure 120 may be removed by suitable processes such as for example chemical mechanical polishing (CMP) processes and/or etching processes. In some embodiments, a lattice plane 124 of the epitaxy structure 120 is formed after removing the portions of the planar layer 130 and the epitaxy structure 120, in which the lattice plane 124 has Miller index (100).

In some embodiments, the exposed portion 122 of the epitaxy structure 120 has a width d3 that is greater than the width d1 (shown in FIG. 1A) of the fin structure 110, but the width d3 of the exposed portion 122 is less than the width d2 (shown in FIG. 1B) of the epitaxy structure 120. For instance, the width d3 may be ranged from about 10 nm to about 60 nm. In some examples, the width d3 may be about 10 nm to about 30 nm. In yet some examples, the width d3 may be about 20 nm to about 45 nm. In yet some examples, the width d3 may be about 30 nm to about 60 nm. In yet some embodiments, the exposed portion 122 of the epitaxy structure 120 still covers the top of the fin structure 110, and a distance d4 between the lattice plane 124 and the top of the fin structure 110 is ranged from about 5 nm to about 30 nm, for example. In some examples, the distance d4 is ranged from about 5 nm to about 20 nm. In yet some examples, the distance d4 is ranged from about 10 nm to about 30 nm.

Figure 1E:
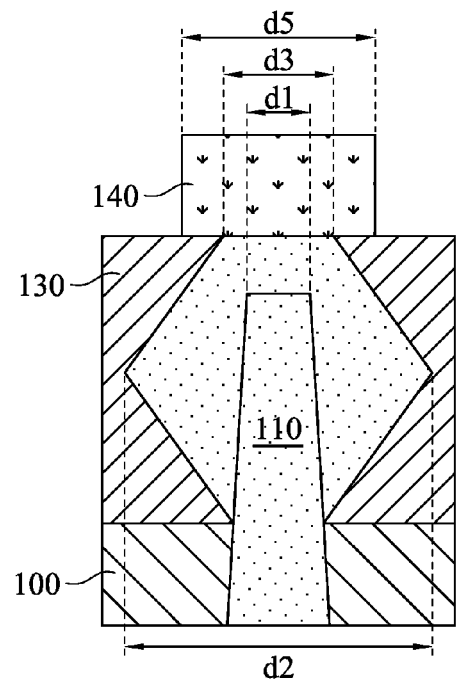

As illustrated in FIG. 1E, a masking layer 140 is formed over the exposed portion 122 of the epitaxy structure 120. In some embodiments, the masking layer 140 is formed of a patterned photoresist layer. In examples, the masking layer 140a has a width d5 that is greater than the width d3 of the exposed portion 122. In yet some embodiments, however, the width d5 of the masking layer 140 may be less than the width d3 of the exposed portion 122 but is greater than the width d1 of the fin structure 110. In yet some embodiments, the width d5 of the masking layer 140 may be about 1.5 folds to about 4 folds of the width d1 of the fin structure 110. In yet some embodiments, the width d5 of the masking layer 140 may be greater than the width d3 of the exposed portion 122 and less than the maximum width d2 of the epitaxy structure 120. Particularly, the width d5 may be ranged from about 10 nm to about 60 nm. In some examples, the width d5 may be about 10 nm to about 25 nm. In yet some examples, the width d5 may be about 15 nm to about 40 nm. In yet some examples, the width d5 may be about 25 nm to about 60 nm.

Figure 1F:
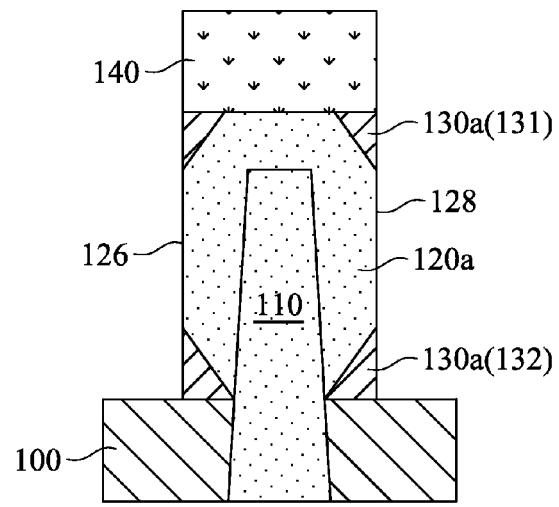

Thereafter, as illustrated in FIG. 1F, the planar layer 130 and the epitaxy structure 120 are patterned by using the masking layer 140, and thereby a remaining portion 130a of the planar layer 130 and a remaining epitaxy structure 120a are obtained. In the operation of patterning the planar layer 130 and the epitaxy structure 120, the pattern of the masking layer 140 is transferred to the planar layer 130 and the epitaxy structure 120. For instance, anisotropic etching processes such as for example dry etching processes may be utilized. In examples, the etching process uses a mixture of HBr, $Cl_2$ and $O_2$ as an etchant. In some embodiments, the remaining portion 130a of the planar layer 130 includes a first portion 131 and a second portion 132, and the first portion 131 is spaced apart from the second portion 132 by the remaining epitaxy structure 120a. In some examples, the first portion 131 is located between the masking layer 140 and the remaining epitaxy structure 120a, whereas the second portion 132 is located between the remaining epitaxy structure 120a and the substrate 100. In yet some embodiments, the operation of patterning the planar layer 130 and the epitaxy structure 120 includes forming lattice planes 126 and 128 on the remaining epitaxy structure 120a. Both the lattice planes 126 and 128 have Miller index (110), and are positioned on opposite sides of the remaining epitaxy structure 120a.

Figure 1G:
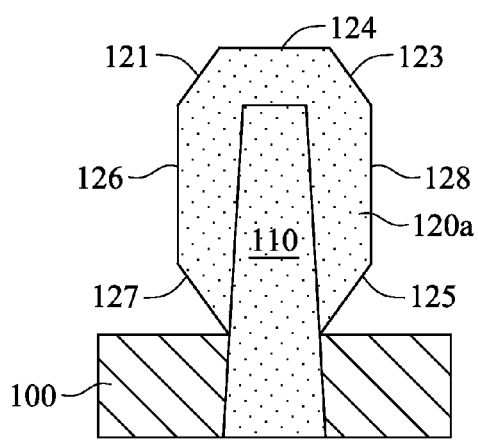

As shown in FIG. 1G, the masking layer 140 and the remaining portion 130a of the planar layer 130 are removed so that the remaining epitaxy structure 120a is exposed. In some embodiments, when the first portion 131 of the remaining portion 130a of the planar layer 130 is removed, the lattice planes 121, 123 are exposed, and thus forming slant planes on the remaining epitaxy structure 120a. In yet some embodiments, when the second portion 132 of the remaining portion 130a of the planar layer 130 is removed, the lattice planes 125, and 127 are exposed, and at least an undercut is formed under the lattice planes 125 and/or 127. In yet some embodiments, the remaining epitaxy structure 120a includes lattice planes 121, 123, 125, and 127 with Miller index (111), lattice plane 124 with Miller index (100), and lattice planes 126 and 128 with Miller index (110).

Figure 1H:
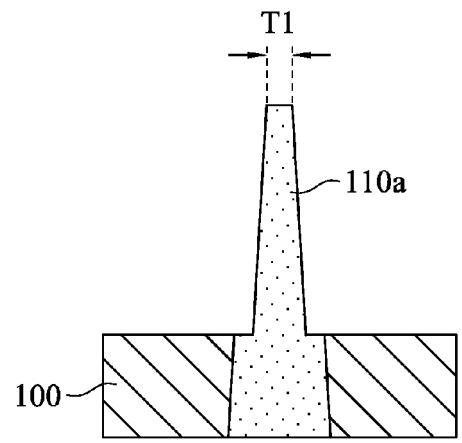

Subsequently, the structure illustrated in FIG. 1G is partially removed to form a trimmed fin structure 110a, as shown in FIG. 1H. Specifically, the remaining epitaxy structure 120a is removed, and further a portion of the fin structure 110 is removed so that the trimmed fin structure 110a has a smaller width T1 than the width d1 (shown in FIG. 1A) of the fin structure 110. For instance, the width T1 may be ranged from about 3 nm to about 20 nm. In some examples, the width T1 may be about 3 nm to about 10 nm. In yet some examples, the width T1 may be about 7 nm to about 12 nm. In yet some examples, the width T1 may be about 10 nm to about 20 nm. In some embodiments, the operation of forming the trimmed fin structure 110a includes applying a wet etching process. For examples, the wet etching process may use etchant including tetramethylammonium hydroxide (TMAH), surfactant and organic solvent. For many semiconductor materials such as silicon, silicon germanium or the like, the etching rate depends upon the orientations of the lattice planes. For instance, lattice planes with Miller index (100) have fast etching rates in the etching process, lattice planes with Miller index (110) have moderate etching rates, and lattice planes with Miller index (111) have slow etching rates. Significantly, the difference in etching rates between different lattice planes leads to the tip-top issue in typical fin-trimming approaches. Accordingly, the shape of the remaining epitaxy structure 120a with certain lattice planes shown in FIG. 1G is configured to compensate the difference in etching rates between different lattice planes during the etching process. For example, the portion between the lattice plane 124 and the top of the fin structure 110 is configured to compensate the rapid etching rate on the lattice plane with Miller index (100), and this portion may be controlled by the distance d4 (shown in FIG. 1D) between the lattice plane 124 and the top of the fin structure 110. Therefore, the height of the fin structure 110 may be kept. Furthermore, the lattice planes 121 and 123 with Miller index (111) having slow etching rate are configured to avoid the tip-top issue, and therefore a flat top of the trimmed fin structure 110a may be obtained. In addition, the side portion with the lattice planes 126 and 128 is configured to compensate the moderate etching rate on the lattice planes with Miller index (110), and this side portion may be managed by the width d5 (shown in FIG. 1E) of the masking layer 140. Moreover, the lattice planes 125 and 127 with Miller index (111) having slow etching rate may secure the shape of the bottom portion of the trimmed fin structure 110a. Therefore, the trimmed fin structure 110a illustrated in FIG. 1H exhibits a cross section of substantially trapezoidal shape with a flat top according to various embodiments of the present disclosure.

Accordingly, the shape of the remaining epitaxy structure 120a may be well controlled by the method illustrates in FIGS. 1A-1F, and more significantly the trimmed fin structure 110a exhibits a substantially conformal shape in consistence with the original fin structure 110, and provides an excellent electrical performance for active devices such as FinFETs.

FIGS. 2A-2H are schematic cross-sectional views showing methods for trimming a fin structure according to various embodiments of the present disclosure. In 2A-2H, the same or similar features are identified by the same reference numerals. These features are the same as or similar to like-numbered features described with respect to FIGS. 1A-1H. Therefore, these features are descried briefly to avoid repetition.

Figure 2A:
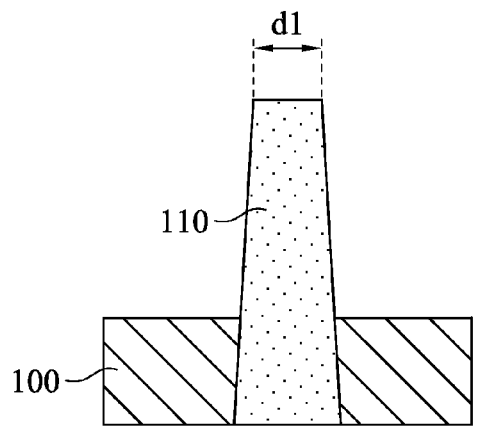
FIGS. 2A-2H are schematic cross-sectional views showing methods for trimming a fin structure according to various embodiments of the present disclosure.

As shown in FIG. 2A, a fin structure 110 is formed over a substrate 100. Other features and details of the substrate 100 and the fin structure 110 may be the same as those described above in connection with FIG. 1A. In various examples, the fin structure 110 has a width d1 which is ranged from about 5 nm to about 25 nm. In some examples, the width d1 may be about 5 nm to about 15 nm. In yet some examples, the width d1 may be about 10 nm to about 20 nm. In yet some examples, the width d1 may be about 15 nm to about 25 nm.

Figure 2B:
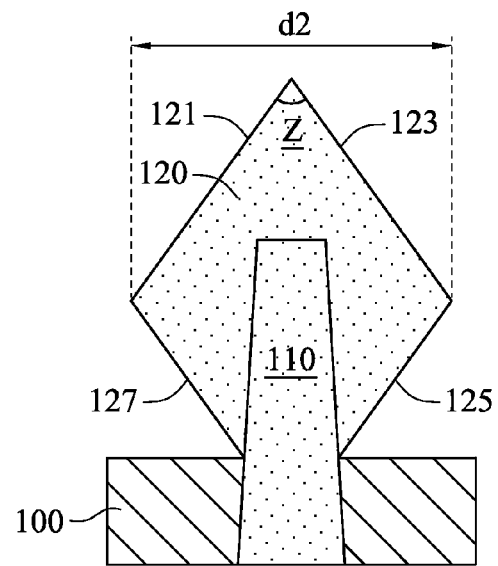

Referring to FIG. 2B, an epitaxy structure 120 is formed on the fin structure 110. In some embodiments, the epitaxy structure 120 includes the same material as the fin structure 110 so that semiconductor material may be epitaxially grown on the exposed surface of the fin structure 110 to form the epitaxy structure 120. In some embodiments, the epitaxy structure 120 includes a first lattice plane 121, a second lattice plane 123, a third lattice plane 125 and a fourth lattice plane 127. Each of the first, second, third and fourth lattice planes 121, 123, 125, 127 has a Miller index (111). In some embodiments, the maximum width d2 may be about 2.5 folds to about 6 folds of the width d1 of the fin structure 110. For example, the maximum width d2 of the epitaxy structure 120 may be about 25 nm to about 60 nm. In some examples, the width d2 may be about 25 nm to about 40 nm. In yet some examples, the width d2 may be about 30 nm to about 50 nm. In yet some examples, the width d2 may be about 40 nm to about 60 nm. Other features and details of the epitaxy structure 120 may be the same as those described above in connection with FIG. 1B.

Figure 2C:
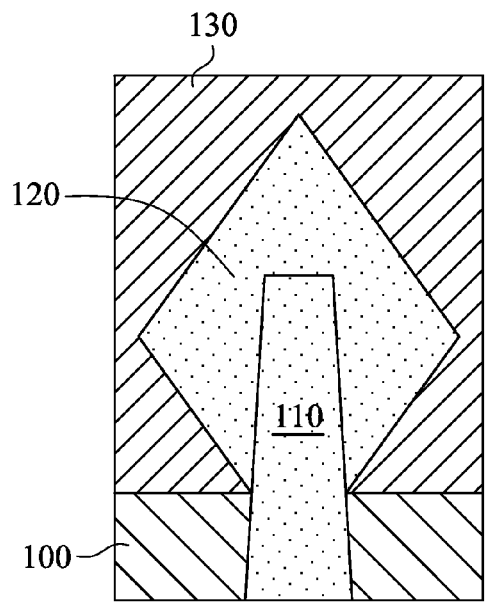

With reference to FIG. 2C, a planar layer 130 is subsequently formed to cover the epitaxy structure 120. In some embodiments, the planar layer 130 includes applying a flowable oxide on the substrate 130, and therefore the space under the lattice planes 125 and 127 (shown in FIG. 2B) of the epitaxy structure 120 may be filled with the planar layer 130. Other features and details of the planar layer 130 may be the same as those described above in connection with FIG. 1C.

Figure 2D:
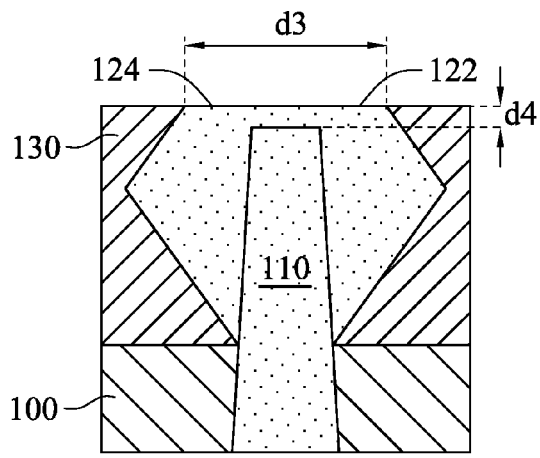

As illustrated in FIG. 2D, a portion of the planar layer 130 and a portion of the epitaxy structure 120 are removed such that a portion 122 of the epitaxy structure 120 is exposed out of the planar layer 130. In some embodiments, a lattice plane 124 with Miller index (100) is formed on the exposed portion 122 of the epitaxy structure 120 after or during the operation of removing the portions of the planar layer 130 and the epitaxy structure 120. In some embodiments, the exposed portion 122 of the epitaxy structure 120 has a width d3 that is greater than the width d1 (shown in FIG. 2A) of the fin structure 110, but is less than the width d2 (shown in FIG. 2B) of the epitaxy structure 120. For instance, the width d3 may be ranged from about 10 nm to about 60 nm. In some examples, the width d3 may be about 10 nm to about 30 nm. In yet some examples, the width d3 may be about 20 nm to about 45 nm. In yet some examples, the width d3 may be about 30 nm to about 60 nm. In yet some embodiments, a distance d4 between the lattice plane 124 and the top of the fin structure 110 is ranged from about 5 nm to about 30 nm, for example. In some examples, the distance d4 is ranged from about 5 nm to about 20 nm. In yet some examples, the distance d4 is ranged from about 10 nm to about 30 nm. Other features and details of the planar layer 130 may be the same as those described above in connection with FIG. 1D.

Figure 2E:
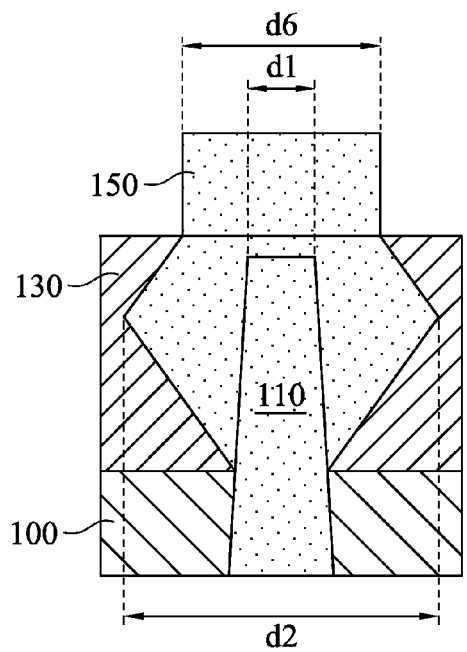

Referring to FIG. 2E, an epitaxy layer 150 is epitaxially grown on the exposed portion 122 of the epitaxy structure 120. In some embodiments, the epitaxy layer 150 includes the same material as the epitaxy structure 120 and the fin structure 110. For example, the epitaxy layer 150 may include semiconductor materials such as silicon, silicon germanium or the like. In some embodiments, the epitaxy layer 150 is formed on the exposed portion 122 only so that the width d6 of the epitaxy layer 150 is substantially the same as the width d3 (shown in FIG. 2D) of the exposed portion 122. Particularly, the width d6 may be ranged from about 10 nm to about 60 nm. In some examples, the width d6 may be about 10 nm to about 30 nm. In yet some examples, the width d6 may be about 20 nm to about 45 nm. In yet some examples, the width d6 may be about 30 nm to about 60 nm. Specifically, the epitaxy layer 150 may be epitaxially grown on the exposed portion 122, and naturally no epitaxy layer is formed on the top surface of the planar layer 130. In yet some embodiments, the top surface of the epitaxy layer 150 includes a lattice plane with Miller index (100). In yet some embodiments, the epitaxy process may use molecular beam epitaxy, vapor-phase epitaxy (VPE), ultra-high vacuum CVD (UHV-CVD)) or other suitable techniques. In some examples, the epitaxy process may use precursors which interact with the composition of exposed portion 122 of the epitaxy structure 120. In some examples, the precursors interact with silicon of the exposed portion 122. In yet some examples, the precursors interact with silicon germanium (SiGe) of the exposed portion 122 of the epitaxy structure 120.

In some embodiments, the width d6 of the epitaxy layer 150 is greater than the width d1 of the fin structure 110. In some examples, the width d6 of the epitaxy layer 150 may be about 1.5 folds to about 4 folds of the width d1 of the fin structure 110. In yet some embodiments, the width d6 of the epitaxy layer 150 is less than the maximum width d2 of the epitaxy structure 120.

Figure 2F:
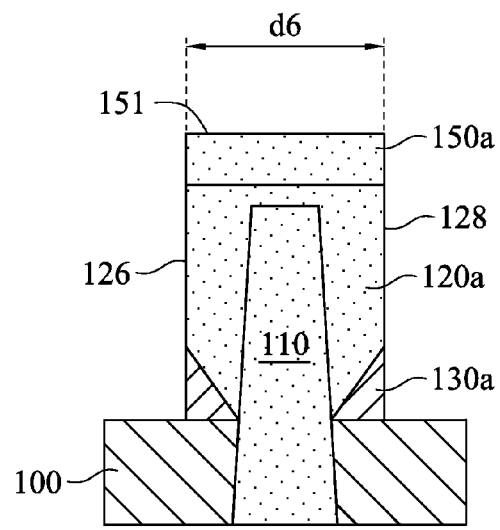

As shown in FIG. 2F, the planar layer 130 and the epitaxy structure 120 are patterned, and thereby a remaining portion 130a of the planar layer 130 and a remaining epitaxy structure 120a are obtained. In some embodiments, the epitaxy layer 150 is used as a hard mask to pattern the planar layer 130 and the epitaxy structure 120. In examples, the epitaxy layer 150 is partially removed in the operation of patterning the planar layer 130 and the epitaxy structure 120, and a lattice plane 151 with Miller index (100) is formed on the top surface of the remaining epitaxy layer 150a. In yet some embodiments, the operation of patterning the planar layer 130 and the epitaxy structure 120 includes forming lattice planes 126 and 128 on the remaining epitaxy structure 120a. Both the lattice planes 126 and 128 have Miller index (110), and are positioned on opposite sides of the remaining epitaxy structure 120a. In yet some embodiments, the remaining portion 130a of the planar layer 130 is positioned between the substrate 100 and the remaining epitaxy structure 120a. Any suitable anisotropic etching processes may be used to pattern the planar layer 130 and the epitaxy structure 120. In examples, the patterning operation includes applying a dry etching process using a mixture of HBr, Cl$_2$ and O$_2$ as an etchant.

Figure 2G:
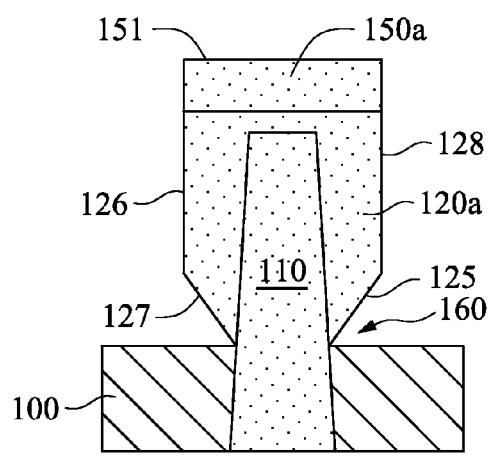

With reference to FIG. 2G, the remaining portion 130a of the planar layer 130 is removed. According to some embodiments of the present disclosure, when the remaining portion 130a of the planar layer 130 is removed, the lattice planes 125 and 127 are exposed, and at least an undercut 160 of the remaining epitaxy structure 120a is formed under the lattice planes 125 and/or 127. In some embodiments, the remaining portion 130a of the planar layer 130 is removed by wet etching processes. For example, any etchant suitable for removing oxide may be used in the wet etching process.

Figure 2H:
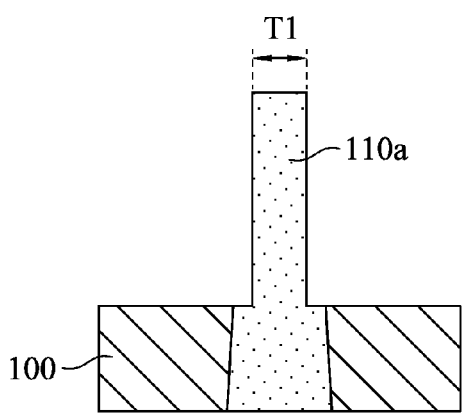

As illustrated in FIG. 2H, the structure illustrated in FIG. 2G is partially removed to form a trimmed fin structure 110a, as shown in FIG. 2H. In some embodiment, the remaining epitaxy structure 120a is removed, the remaining epitaxy layer 150a is partially or completely removed, and further a portion of the fin structure 110 is removed so that the trimmed fin structure 110a has a smaller width T1 than the width d1 (shown in FIG. 2A) of the fin structure 110. For instance, the width T1 may be ranged from about 3 nm to about 20 nm. In some examples, the width T1 may be about 3 nm to about 10 nm. In yet some examples, the width T1 may be about 7 nm to about 12 nm. In yet some examples, the width T1 may be about 10 nm to about 20 nm. In some embodiments, the operation of forming the trimmed fin structure 110a includes applying a wet etching process. For examples, the wet etching process may use etchant including tetramethylammonium hydroxide (TMAH), surfactant and organic solvent. The etching rate depends upon the orientations of the lattice planes. For example, lattice planes with Miller index (100) have fast etching rates in the etching process, lattice planes with Miller index (110) have moderate etching rates, and lattice planes with Miller index (111) have slow etching rates. Significantly, the difference in etching rates between different lattice planes leads to the tip-top issue in general fin-trimming approaches. Accordingly, the shape of the remaining epitaxy structure 120a with certain lattice planes shown in FIG. 2G is configured to compensate the difference in etching rates between different lattice planes during the etching process.

The trimmed fin structure 110a illustrated in FIG. 2H exhibits a cross section of substantially rectangular shape according to various embodiments of the present disclosure. Significantly the thickness and width of the epitaxy layer 150 may be independently controlled through the operations illustrated in FIG. 2D and FIG. 2E, and therefore not only avoid the tip-top issue but also modify the sidewall profile of the trimmed fin structure 110a. In specifics, the epitaxy layer 150 (or the remaining epitaxy layer 150a) may compensate the rapid etching rate on the lattice plane with Miller index (100). Therefore, a flat top and a height of the trimmed fin structure 110a may be secured. In addition, the side portion with the lattice planes 126 and 128 may compensate the moderate etching rate on the lattice planes with Miller index (110). Also, the lattice planes 125, and 127 with Miller index (111) having slow etching rate may secure the shape of the bottom portion of the trimmed fin structure 110a. Consequently, after etching the structure illustrated in FIG. 2G, the trimmed fin structure 110a shows a cross section of substantially rectangular shape, as shown in FIG. 2H.

Other features may optionally be formed after the trimmed fin structure 110a is fabricated. FIGS. 3A-3D are perspective views schematically illustrating other features formed in various fabrication stages according to various embodiments of the present disclosure.

Figure 3A:
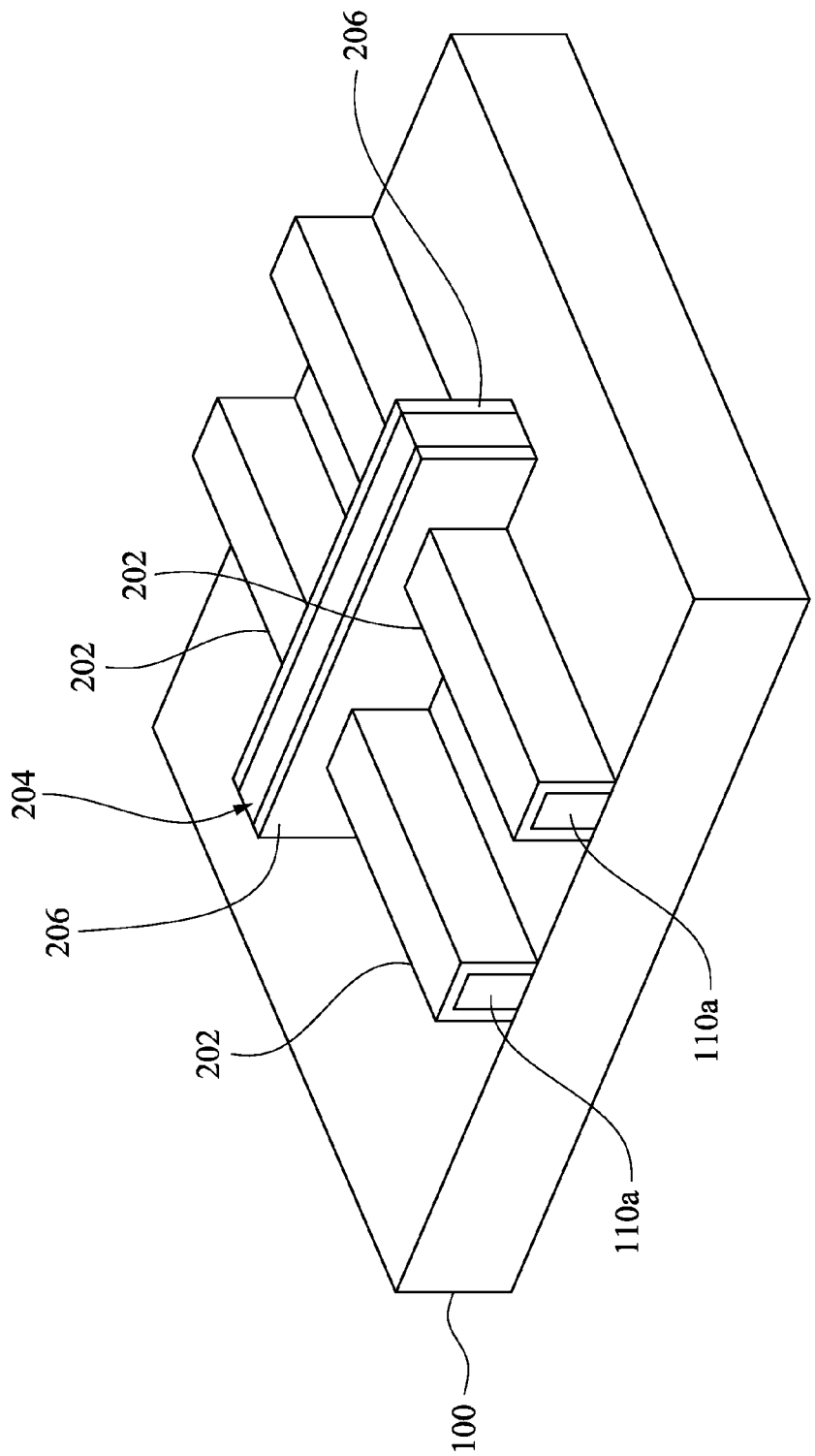
FIGS. 3A-3D are perspective views schematically illustrating other features of an integrated circuit device formed in various fabrication stages according to various embodiments of the present disclosure.

As shown in FIG. 3A, in some embodiments, the fin structure 110a may optionally include a strain-inducing layer 202 formed thereon so as to increase the carrier mobility. The strain-inducing layer 202 may contain suitable material and induce a certain strain such as a compressive strain or a tensile strain, depending upon the type of the device being fabricated, such as a p-channel FETs (PFETs) or an re-channel FETs (NFETs).

In some embodiments, a gate structure 204 may be formed over a portion of the fin structure 110a, and the gate structure 204 traverses the fin structure 110a. In some embodiments, the gate structure 204 may include a gate electrode and a gate dielectric layer. The gate dielectric layer may be made of dielectric material such as for example silicon oxide, silicon nitride, high-k dielectric material, and/or other suitable dielectric material. Examples of high-k dielectric material include, but are limited to, HfZrO, HfSiON, HfTaO, HfSiO, HfTiO, HfO$_2$, zirconium oxide, aluminum oxide, or the like. The gate electrode may include any suitable material such as for example polysilicon, copper, titanium, aluminum, tantalum, tungsten, molybdenum, nickel silicide, cobalt silicide, or other suitable materials. The gate structure 204 may further include spacers 206, as illustrated in FIG. 3A. The spacers 206 may be formed by any suitable process to any suitable thickness. In some examples, the spacers 206 may include a dielectric material such as for example silicon nitride, silicon carbide, silicon oxynitride, or the like.

In addition, before or after the spacers 206 are formed, doped regions such as source and drain regions may be formed in the fin structure 110a according to some embodiments of the present disclosure. The gate structure 204 traversing the fin structure 110a may separate the doped source and drain regions. The source and drain regions may include lightly doped regions and/or heavily doped source. The doping species depend on the type of the device being fabricated, such as a p-channel FETs (PFETs) or an n-channel FETs (NFETs). The doped source and drain regions may be formed by implantation processes, diffusion process, and/or other suitable processes. In some embodiments, an annealing process may further be performed to activate the source and drain regions. The annealing processes may be, for example, a laser annealing process, a rapid thermal annealing (RTA) process, and/or other suitable annealing processes.

Figure 3B:
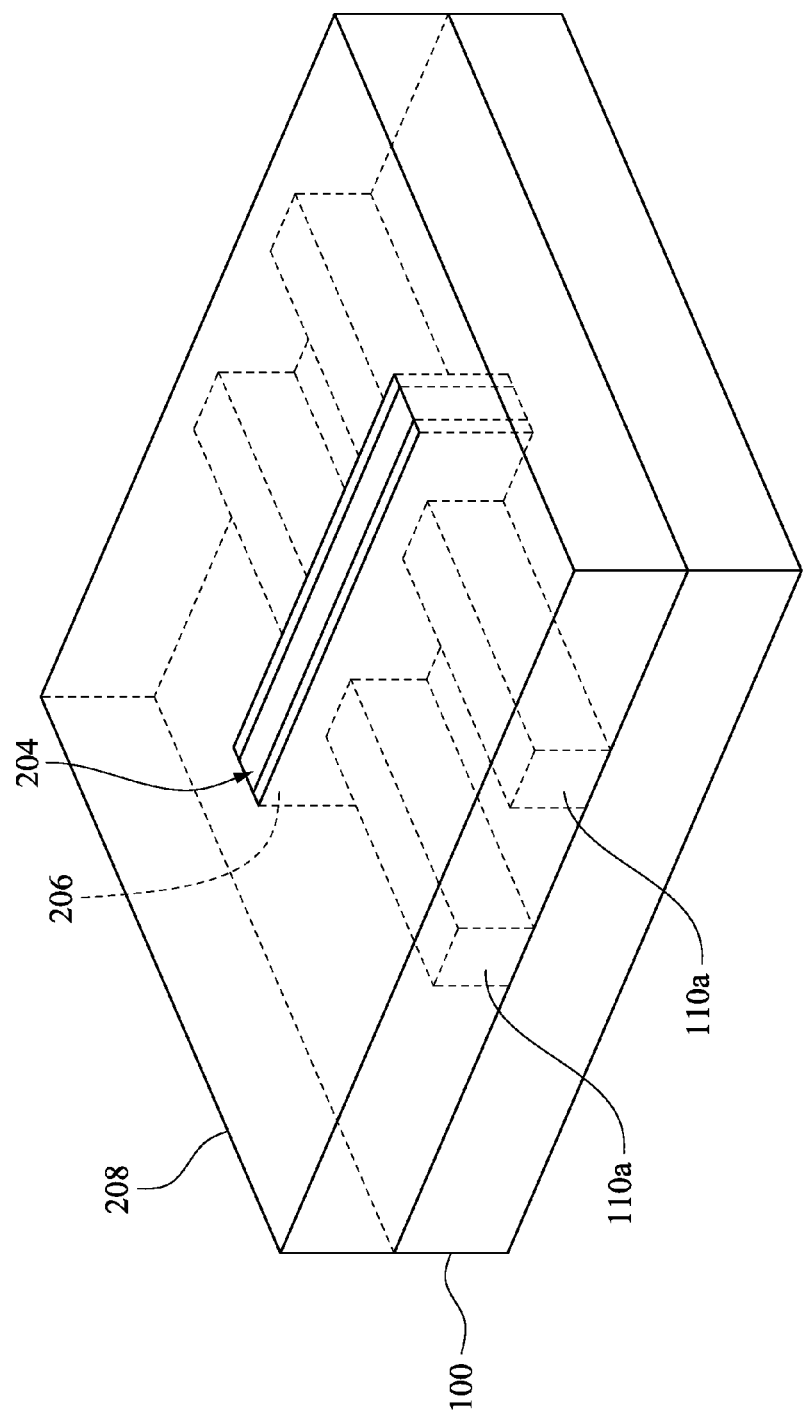

As illustrated in FIG. 3B, in some embodiments, a capping layer 208 may be formed over both the fin structure 110a and the gate structure 204. The capping layer 212 may include materials such as for example silicon oxide, silicon oxynitride (SiON), silicon nitride, SiC, SiOC, spin-on glass (SOG), a low-k material, or the like. In some examples, chemical mechanical polishing (CMP) processes may be performed to planarize the capping layer 208. In specifics, the CMP process may be performed until a portion of the gate structure 204 are exposed.

Figure 3C:
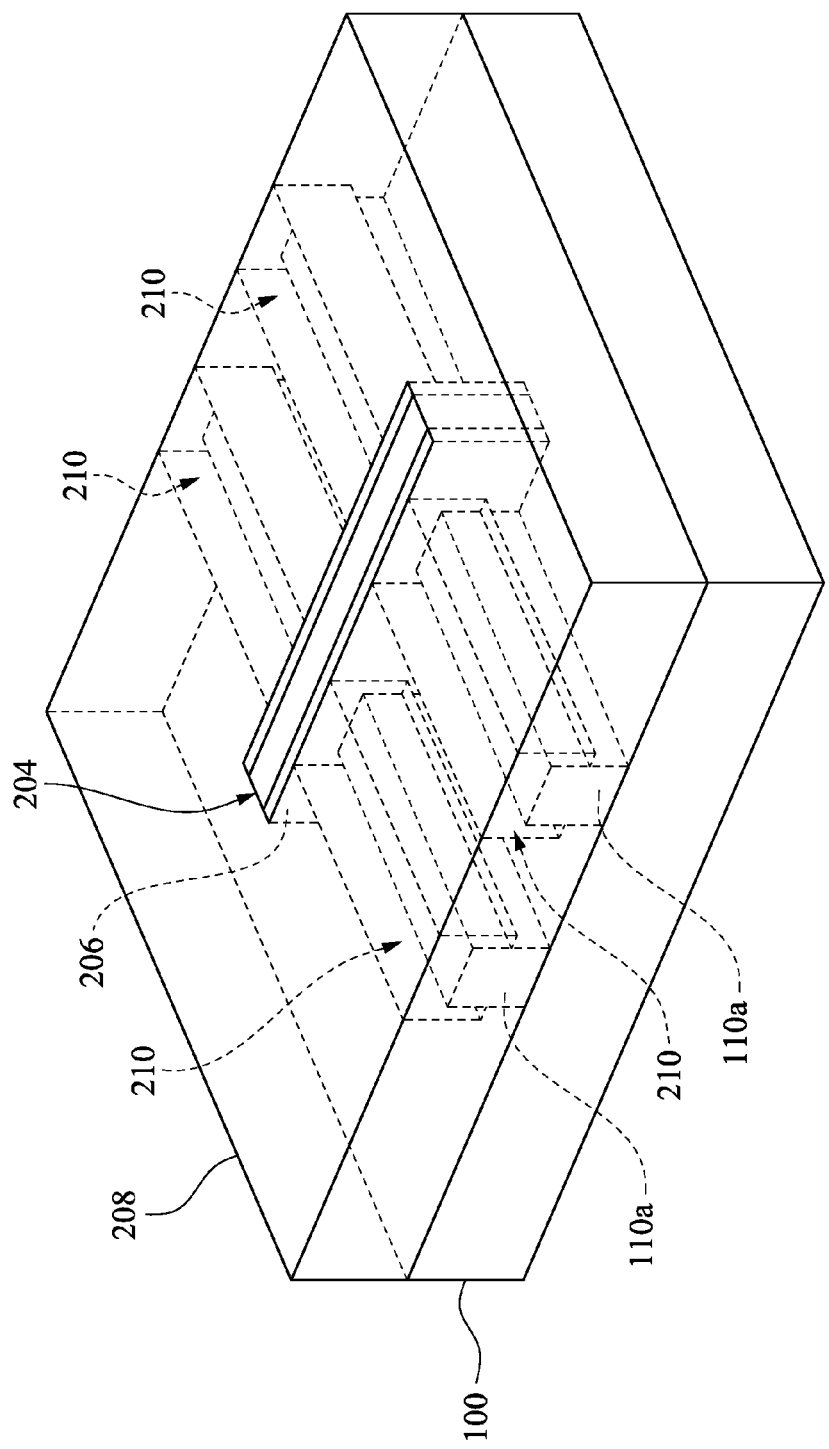

In yet some embodiments, as illustrated in FIG. 3C, one or more openings 210 are formed in the capping layer 208 to expose portions of the fin structure 110a. The openings 210 may be formed by any conventional method such as for example photolithography and etching approaches.

Figure 3D:
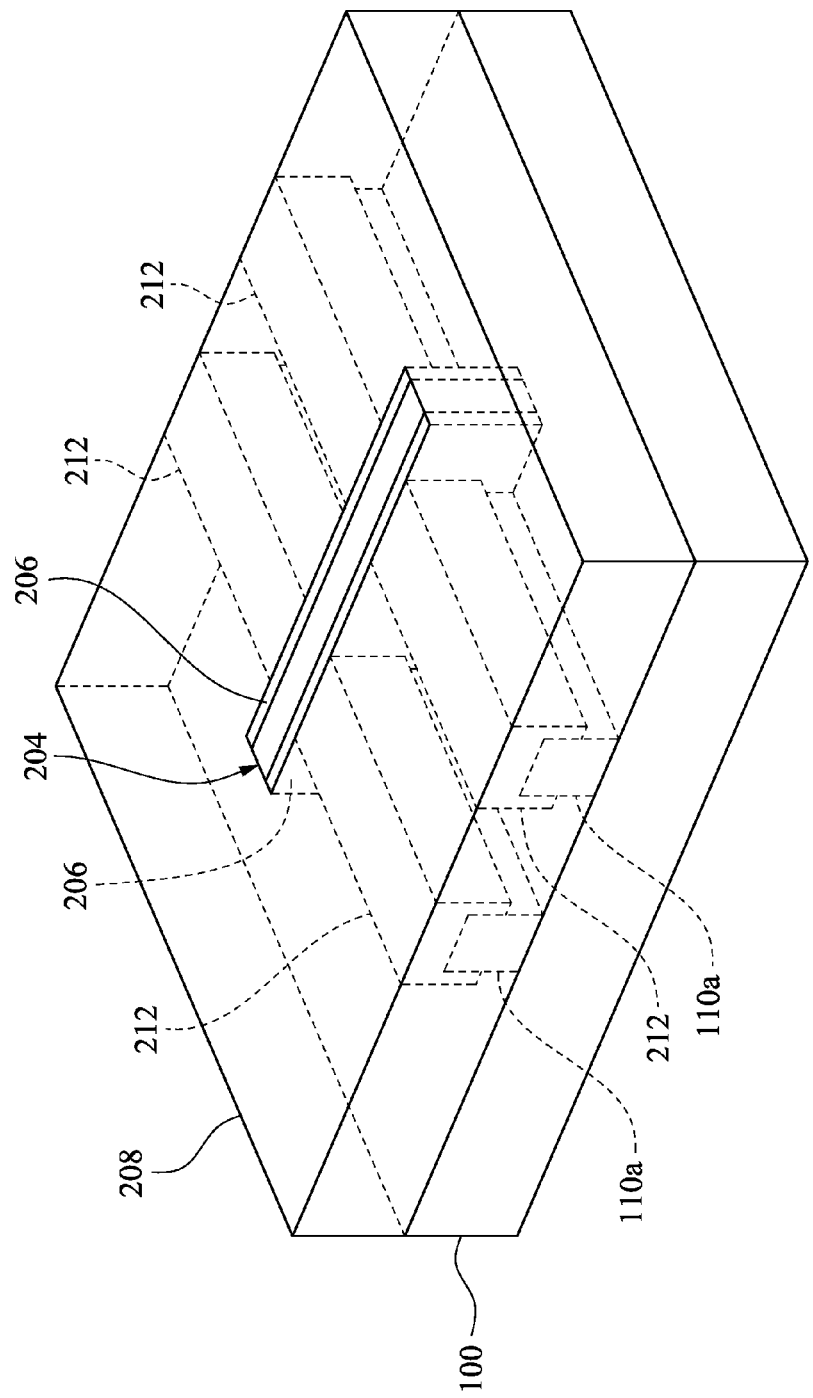

As illustrated in FIG. 3D, in some embodiments, an epitaxial layer 212 may be grown on the exposed portions of the fin structure 110a to form raised source and drain reasons. In specifics, the epitaxial layer 212 may be grown over the exposed portions of the fin structure 110a within the opening 210 using one or more epitaxy processes. Any suitable epitaxy processes may be employed to form the epitaxial layer 212. For example, vapor-phase epitaxy (VPE), ultra-high vacuum CVD (UHV-CVD), molecular beam epitaxy or other suitable processes may be used. The epitaxy process may use gaseous and/or liquid precursors, which interact with the composition of the fin structure 110a. In addition, the epitaxial layer 212 may contain silicon formed by silicon epitaxial deposition processes according to some embodiments of the present disclosure. In yet some embodiments, the epitaxial layer 212 may contain silicon germanium (SiGe). Additionally, the epitaxial layer 212 may be a doped epitaxial layer in some examples of the present disclosure. For example, the epitaxial layer 212 may include a silicon epitaxial layer doped with phosphorous. Further, the doped epitaxial layer may have a gradient doping profile. In yet some examples, a CMP process may be subsequently performed to planarize the epitaxial layer 212.

Other features may continuously be fabricated, including for example, forming an interconnect metal routing layer, an inter-layer dielectric (ILD) layers, via contacts, inter-metal dielectric (IMD) layers and metallic connecting wire and/or other suitable features, according to various embodiments of the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

As used herein, the term "and/or" includes any and all combinations of one or more of the associated listed items.

Advantages of various embodiments of the present disclosure include providing novel methods of trimming fin structures for active devices such as FinFETs. The methods disclosed herein provide an excellent shape of the fin structure, and therefore the FinFET exhibits excellent electrical performances such as for example a low leakage current and a high ratio of turn-on current to turn-off current ($I_{on}/I_{off}$). The epitaxy structure with certain shapes and lattice planes disclosed herein compensates the difference in etching rates between different lattice planes during the etching process, and thereby obtaining an excellent cross section of the fin structure.

In accordance with one aspect of some embodiments, a method includes the operations described below. A fin structure is formed over a substrate. An epitaxy structure is formed on the fin structure. A planar layer is formed to cover the epitaxy structure. Portions of the planar layer and the epitaxy structure are removed such that a portion of the epitaxy structure is exposed out of the planar layer. A masking layer is formed over the exposed portion of the epitaxy structure. The planar layer and the epitaxy structure are patterned by using the masking layer, and thereby a remaining portion of the planar layer and a remaining epitaxy structure are obtained. The masking layer and the remaining portion of the planar layer are removed. Thereafter, the remaining epitaxy structure and a portion of the fin structure are removed so as to form a trimmed fin structure.

In accordance with another aspect of some embodiments, a method includes the operations described below. A fin structure is formed over a substrate. An epitaxy structure is formed on the fin structure. A planar layer is formed to cover the epitaxy structure. Portions of the planar layer and the epitaxy structure are removed such that a portion of the epitaxy structure is exposed out of the planar layer. An epitaxy layer is epitaxially grown on the exposed portion of the epitaxy structure. The planar layer and the epitaxy structure are patterned so that a remaining portion of the planar layer and a remaining epitaxy structure are obtained. The remaining portion of the planar layer is removed. Thereafter, the remaining epitaxy structure and portions of the epitaxy layer and the fin structure are removed so as to form a trimmed fin structure.

In accordance with another aspect of some embodiments, a method includes the operations described below. A fin structure is formed over a substrate. An epitaxy structure is epitaxially grown on the fin structure such that fin structure is clad in the epitaxy structure. The epitaxy structure includes a first lattice plane with Miller index (111), a second lattice plane with Miller index (100) and a third lattice plane with Miller index (110), and the first lattice plane with Miller index (111) forms an undercut of the epitaxy structure. The epitaxy structure and a portion of the fin structure are subsequently removed to obtain a trimmed fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin structure over a substrate;
   forming an epitaxy structure on the fin structure;
   forming a planar layer covering the epitaxy structure;
   removing portions of the planar layer and the epitaxy structure such that a portion of the epitaxy structure is exposed out of the planar layer;
   forming a masking layer over the exposed portion of the epitaxy structure;
   patterning the planar layer and the epitaxy structure by using the masking layer, and thereby obtaining a remaining portion of the planar layer and a remaining epitaxy structure;
   removing the masking layer and the remaining portion of the planar layer; and
   removing the remaining epitaxy structure and a portion of the fin structure.

2. The method according to claim 1, wherein the act of forming the epitaxy structure comprises forming a first, a second, a third and a fourth lattice plane of the epitaxy structure.

3. The method according to claim 2, wherein the first lattice plane and the second lattice plane form a top angle of the epitaxy structure, and the top angle is about 50 degrees to about 60 degrees.

4. The method according to claim 2, wherein each of the first, second, third and fourth lattice planes has a Miller index (111).

5. The method according to claim 2, wherein the epitaxy structure has a maximum width that is about 2 folds to about 7 folds of a width of the fin structure.

6. The method according to claim 1, wherein the act of forming the planar layer comprises coating a flowable oxide over the substrate.

7. The method according to claim 1, wherein the act of removing the portions of the planar layer and the epitaxy structure comprises forming a lattice plane of the epitaxy structure by a chemical mechanical polishing (CMP) process, and the lattice plane has a Miller index (100).

8. The method according to claim 1, wherein the exposed portion of the epitaxy structure has a width that is greater than a width of the fin structure.

9. The method according to claim 1, wherein the exposed portion of the epitaxy structure has a lattice plane, and a distance between the a lattice plane and a top of the fin structure is ranged from about 5 nm to about 30 nm.

10. The method according to claim 1, wherein the act of forming the masking layer comprises forming a patterned photoresist that has a width of greater than a width of the exposed portion.

11. The method according to claim 1, wherein the masking layer has a width that is about 1.5 folds to about 4 folds of a width of the fin structure.

12. The method according to claim 1, wherein the masking layer has a width that is greater than a width of the exposed portion and less than a maximum width of the epitaxy structure in the act of forming the masking layer.

13. The method according to claim 1, wherein the remaining portion of the planar layer comprises a first portion and a second portion, and the first portion is spaced apart from the second portion by the remaining epitaxy structure.

14. The method according to claim 13, wherein the first portion is located between the masking layer and the remaining epitaxy structure, and the second portion is located between the remaining epitaxy structure and the substrate.

15. The method according to claim 1, wherein the act of patterning the planar layer and the epitaxy structure comprises forming a lattice plane of the epitaxy structure, and the lattice plane has a Miller index (110).

16. The method according to claim 1, wherein the act of removing the remaining epitaxy structure and the portion of the fin structure comprises applying an etchant containing tetramethylammonium hydroxide (TMAH).

17. A method, comprising:
   forming a fin structure over a substrate;
   forming an epitaxy structure on the fin structure;
   forming a planar layer covering the epitaxy structure;
   removing portions of the planar layer and the epitaxy structure such that a portion of the epitaxy structure is exposed out of the planar layer;
   epitaxially growing an epitaxy layer on the exposed portion of the epitaxy structure;
   patterning the planar layer and the epitaxy structure, and thereby obtaining a remaining portion of the planar layer and a remaining epitaxy structure;
   removing the remaining portion of the planar layer; and
   removing the remaining epitaxy structure and portions of the epitaxy layer and the fin structure.

18. The method according to claim 17, wherein the act of patterning the planar layer and the epitaxy structure comprises using the epitaxy layer as a hard mask.

19. The method according to claim 17, wherein the act of patterning the planar layer and the epitaxy structure comprises forming a lattice plane having a Miller index (110) of the remaining epitaxy structure.

20. A method of trimming a fin structure for a fin-like field effect transistor, comprising:
   forming a fin structure on a substrate;
   epitaxially growing an epitaxy structure cladding the fin structure, wherein the epitaxy structure comprises a first lattice plane with Miller index (111), a second lattice plane with Miller index (100) and a third lattice plane with Miller index (110), and the first lattice plane with Miller index (111) forms an undercut of the epitaxy structure; and
   removing the epitaxy structure and a portion of the fin structure to obtain a trimmed fin structure.

* * * * *